(12) United States Patent
Fendt et al.

(10) Patent No.: US 10,330,718 B2
(45) Date of Patent: Jun. 25, 2019

(54) CLASSIFICATION OF ELECTRIC CONTACTING BETWEEN TWO CONNECTING ELEMENTS

(75) Inventors: Guenter Anton Fendt, Schrobenhausen (DE); Manfred Kulesch, Damp (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 1886 days.

(21) Appl. No.: 13/807,934

(22) PCT Filed: Jul. 6, 2011

(86) PCT No.: PCT/EP2011/061402
§ 371 (c)(1),
(2), (4) Date: Mar. 8, 2013

(87) PCT Pub. No.: WO2012/004302
PCT Pub. Date: Jan. 12, 2012

(65) Prior Publication Data
US 2013/0169261 A1 Jul. 4, 2013

(30) Foreign Application Priority Data
Jul. 8, 2010 (DE) .................. 10 2010 026 435

(51) Int. Cl.
*G01R 31/04* (2006.01)
*H02J 7/00* (2006.01)
(Continued)

(52) U.S. Cl.
CPC .......... *G01R 31/04* (2013.01); *G01R 31/041* (2013.01); *G05B 1/00* (2013.01); *H01M 10/486* (2013.01); *H02J 7/0047* (2013.01)

(58) Field of Classification Search
CPC .... H02J 7/0047; H01M 10/486; G01R 31/04; G01R 31/041; G05B 1/00
(Continued)

(56) References Cited

U.S. PATENT DOCUMENTS 5,291,118 A * 3/1994 Kojima .............. G01R 31/3624
320/150
5,670,861 A * 9/1997 Nor ........................ B60L 11/185
307/10.7
(Continued)

FOREIGN PATENT DOCUMENTS

JP H04368780 A 12/1992
JP 2001037092 A 2/2001

*Primary Examiner* — Richard Isla
*Assistant Examiner* — Aaron Piggush
(74) *Attorney, Agent, or Firm* — Laurence A. Greenberg; Werner H. Stemer; Ralph E. Locher

(57) ABSTRACT

A device for classifying electrical contacting between a first connecting element of a battery and a second connecting element, which is directly or indirectly connected to an electrical load. A temperature sensor is provided for detecting the temperature of the first connecting element and/or of the second connecting element and a control device, which is coupled to the temperature sensor and which is configured, on the basis of a detecting signal of the temperature sensor, to classify the electrical contacting between the first connecting element and the second connecting element. A corresponding method and to a battery system, as well as a battery receiving system including such a device for classifying electrical contacting. Moreover, there is provided an electrical power supply system with such a battery system and such a battery receiving system.

13 Claims, 2 Drawing Sheets

(51) Int. Cl.
*H01M 10/48* (2006.01)
*G05B 1/00* (2006.01)

(58) Field of Classification Search
USPC .......................... 320/153; 323/318; 324/538
See application file for complete search history.

(56) References Cited

U.S. PATENT DOCUMENTS

| | | | |
|---|---|---|---|
| 6,160,383 A | 12/2000 | Carkner | |
| 2007/0018780 A1* | 1/2007 | Furukawa | B60L 3/0046 338/104 |
| 2008/0094068 A1 | 4/2008 | Scott | |

\* cited by examiner

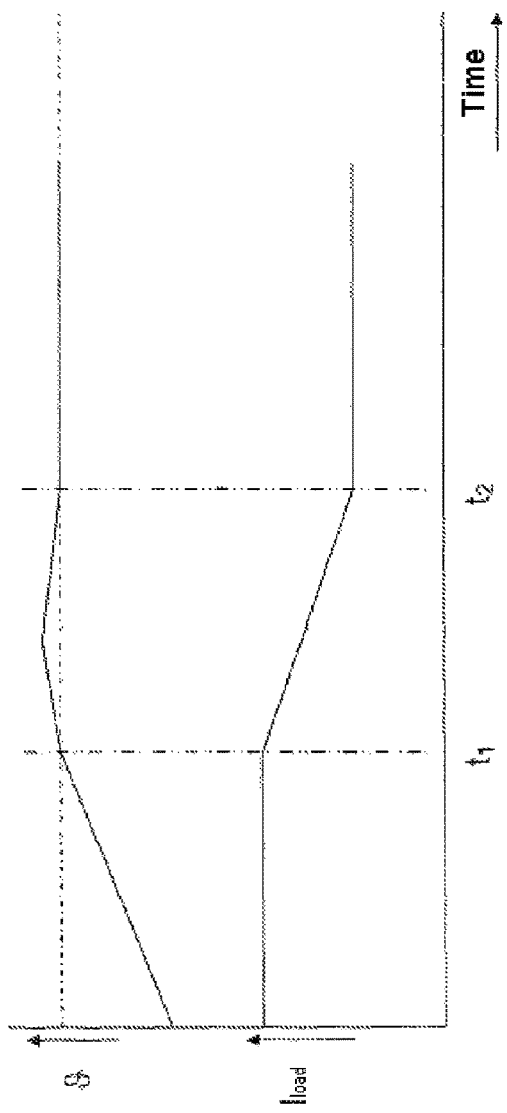
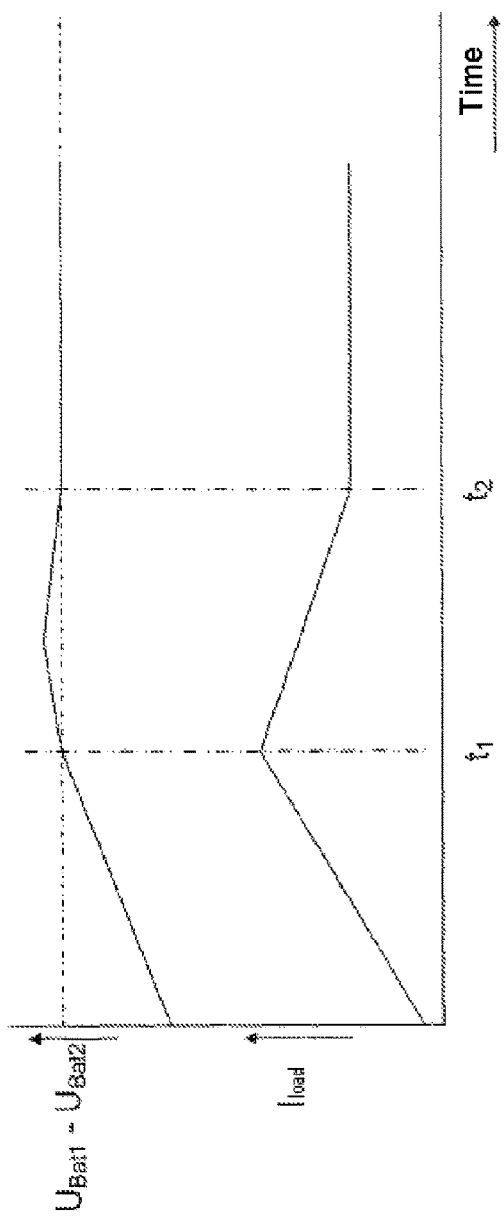

CLASSIFICATION OF ELECTRIC CONTACTING BETWEEN TWO CONNECTING ELEMENTS

BACKGROUND OF THE INVENTION

Field of the Invention

The present invention relates to a design for checking electrical contact between two connection elements, wherein a first connection element is associated with a battery and a second connection element is associated with an electrical load. The electrical load is particularly the drive train of an electric and/or hybrid vehicle. The present invention relates particularly to an apparatus and a method for classifying an electrical contact connection between a first connection element of a battery and a second connection element which is directly or indirectly connected to an electrical load. The present invention also relates to a battery system and to a battery receiving system having such an apparatus for classifying an electrical contact connection. Furthermore, the present invention relates to an electrical power supply system having such a battery system and having such a battery receiving system.

Hybrid or electric vehicles refer to vehicles which are driven partly or completely by electric power. To this end, these vehicles require one or more powerful batteries as energy stores in order to provide the relevant vehicle with sufficient power and/or with a sufficient amount of energy. The former is required in order to provide at least a certain drive power and hence a certain level of travel comfort. The latter is required so that the vehicle can achieve a certain range between two battery charges.

Batteries in electric and/or hybrid vehicles can be charged in different ways. On the basis of a first charging principle, the batteries are charged directly in the vehicle by means of what are known as charging stations. On the basis of a second charging principle, the batteries are charged outside the vehicle at service stations provided specifically for the purpose. The vehicle is supplied with the power by interchanging a complete battery module, wherein an at least partially discharged battery module ("empty battery module") is replaced by an at least partially and preferably completely charged battery module ("full battery module").

In contrast to conventional vehicles which have an internal combustion engine and in which the battery has to provide what is known as a starter current for a short period of time only, the battery in electric and/or hybrid vehicles needs to provide all or part of the power which is required for continuous vehicle operation. Accordingly, electric and/or hybrid vehicles require much more powerful batteries. Furthermore, the electrical contacts between the battery poles (pole contacts) and corresponding vehicle-based connection terminals need to have a particularly low contact resistance so that no undesirable voltage drops occur at the relevant contact points when power is drawn from the battery over a long period.

BRIEF SUMMARY OF THE INVENTION

The present invention is based on the object of specifying an apparatus and a method which can be used to easily and reliably check the quality of a contact connection between a first connection element of a battery and a second connection element which is directly or indirectly connected to an electrical load.

This object is achieved by the subject matter of the independent patent claims. Advantageous embodiments of the present invention are described in the dependent claims. According to a first aspect of the invention, an apparatus for classifying an electrical contact connection between a first connection element of a battery and a second connection element which is directly or indirectly connected to an electrical load is described. The battery is particularly a battery for an electric vehicle and/or a hybrid vehicle. The apparatus described has (a) a temperature sensor for sensing the temperature of the first connection element and/or of the second connection element and (b) a control device which is coupled to the temperature sensor and which is set up to take a sensed signal from the temperature sensor as a basis for classifying the electrical contact connection between the first connection element and the second connection element.

The apparatus described is based on the insight that thermal monitoring of the electrical contact region between a battery and a corresponding battery receptacle allows early recognition of a poor electrical contact quality. In this context, poor electrical contact connection typically results from an increased electrical contact resistance between the first connection element on the battery and the second connection element on the receptacle. However, this means that when current is drawn from the battery a voltage drop occurs between the two connection elements which, together with the present current intensity, determines a dissipative power which is introduced into the contact region and which increases the temperature of the first connection element and/or of the second connection element further. In the case of particularly critical operating states, this could even result in the two connection elements being permanently welded together.

In light of the present invention, electrical connection elements are intended to be understood to mean those contacts which are used to set up an electrical contact connection from the battery or from a battery module to the vehicle-based battery receptacle or battery module receptacle.

According to the invention, the control device classifies the quality of the electrical contact connection by using the level of the sensed signal, which level is characteristic of the present temperature in the contact region. If the sensed signal is used to establish that the temperature is below a prescribed reference temperature, for example, it can be assumed that the contact resistance between the two connection elements is so low that no further measures are required. If the temperature is higher than the reference temperature, however, then it can be assumed that the contact resistance is at least somewhat increased in comparison with a prescribed or admissible reference resistance. This allows early recognition of thermal overload or overheating in the contact region. The control device can take suitable measures which prevent further overheating of the electrical contact region.

The first connection element on the battery may be the connection pole of a battery, for example. The second connection element on the receptacle can also be referred to as a connection terminal. The electrical connection between the two connection elements can be realized by means of any desired mechanical connection, for example a clamp connection, a screw joint, a plug connection or any combination of a plurality of connection types.

According to one exemplary embodiment of the invention, the control device is also set up such that if the sensed signal exceeds a prescribed reference value then the intensity of a current flowing via the two connection elements is reduced. The described measure of reducing the current, which measure should preferably be taken as what is known as an immediate measure when an inadmissible temperature is detected within the contact region, can be implemented in different ways. Thus, by way of example, the flow of current can be interrupted completely by opening a suitable switching element. Optionally, the switching element can be closed again after the contact region has cooled to an appropriate degree, with the result that a flow of current via the two connection elements is again possible.

The apparatus described can therefore reliably prevent undesirable voltage drops on the battery pole contacts and also accompanying heating on the battery pole contacts. In this context, the quality of the electrical contact connection is first of all checked and classified. The current draw from the battery is then reduced as an immediate measure in response to error recognition (recognition of an irregularity in the sensed signal from the temperature sensor or of an excessive temperature increase).

It is pointed out that the sensed signal may be an analog signal or a digital signal depending on the specific application. In the case of an analog sensed signal, the comparison with the reference value is effected on the basis of analog levels. In the case of a digital sensed signal, the sensed signal is compared with a digital reference value.

According to a further exemplary embodiment of the invention, the extent of the reduction in the intensity of the current is dependent on the difference between the level or the value of the sensed signal and a prescribed reference value. This may advantageously mean that the flow of current is reduced to a greater degree when the reference value is exceeded significantly than when the reference value is exceeded only slightly.

Expressed in terms of a good example, this means that when an admissible maximum temperature threshold is exceeded the flow of current is advantageously reduced as a function of the ascertained overtemperature. As already noted above, a correspondingly reduced flow of current can be maintained until the temperature has dropped below this maximum temperature threshold or else another temperature threshold again.

According to a further exemplary embodiment of the invention, the flow of current is effected by means of flow control for the power output from the battery. In the case of an electric vehicle and/or a hybrid vehicle, this can mean that the electrical power output to a drive motor or to a drive train in the vehicle is reduced, for example. The fact that the driver now has only reduced power available in this case is accepted for reasons of dependability.

Reduction or flow control for the flow of current can be effected at the battery by means of a suitable battery management controller, for example. At the vehicle, such current flow reduction can be effected by means of a power management controller or what is known as a vehicle controller in an electric vehicle and/or a hybrid vehicle. According to a further exemplary embodiment of the invention, the temperature sensor is arranged on one of the two connection elements or is integrated in one of the two connection elements. This has the advantage that the temperature of the respective connection element can be sensed without relatively great thermal resistances. As a result, the thermal inertia of the apparatus described can be advantageously reduced, so that suitable measures for current reduction can be taken without lengthy delay when the aforementioned reference temperature is exceeded.

The temperature sensor may be any desired temperature-sensitive element, such as a thermistor. The thermistor may be in the form of an NTC thermistor (low resistance at high temperature) or alternatively as a PTC thermistor (low resistance at low temperature). A combination of different temperature sensors, for example in order to achieve redundancy for the temperature sensing, is also possible.

According to a further exemplary embodiment of the invention, the apparatus also has a data memory which is coupled to the control device. In this case, the control device is also set up to store a result for the classification of the electrical contact connection in the data memory. This has the advantage that a detected overtemperature or an excessive contact resistance on one contact pair or on a plurality of contact pairs, each of which are formed by a first connection element and a second connection element, can be stored in the data memory as an error. The data memory, which is particularly a nonvolatile data memory, can then advantageously be rendered accessible for the purpose of diagnosis and/or maintenance, for example.

It is pointed out that the data memory can also store other information, such as appropriate warning signaling, which provides a person with suitable notification of the fact that an increased temperature has been measured by the temperature sensor. In this context, the warning signaling can be effected in arbitrary fashion, for example in visual, audible and/or haptic fashion.

The data memory described may be a data memory which is separate from the control device. Alternatively, the data memory may also be integrated in the control device and may possibly contain further information for operation of the apparatus described.

According to a further exemplary embodiment of the invention, the apparatus also has at least one further temperature sensor for sensing the temperature of at least one further first connection element of the battery and/or of at least one further second connection element which is directly or indirectly connected to the electrical load. The control device is coupled to the further temperature sensor and is also set up to take a sensed signal from the further temperature sensor as a basis for classifying the electrical contact connection between the further first connection element and the further second connection element. This has the advantage that not just one contact pair (between the first and second connection elements) can be checked for increased temperature or increased contact resistance but also further contact pairs can be checked for such error states. This allows the performance of comprehensive diagnosis concerning the electrical contact connection of a battery or of a battery module which has a plurality of battery cells connected in series and/or parallel in arbitrary fashion. In this case, the battery or the battery module may in principle have any number of connection elements, each of which have a better or worse electrical connection to a complementary connection element.

It is pointed out that the further temperature sensor may also be mounted on a (further) connection element or integrated in a (further) connection element in a manner corresponding to the aforementioned temperature sensor.

According to a further exemplary embodiment of the invention, the apparatus also has a measuring device for measuring a voltage difference (a) between the first connection element and a further first connection element or (b) between the second connection element and a further second connection element. In this case, the measuring device is coupled to the control device or is integrated in the control device. This means that, in addition to at least a temperature measurement which is possibly characteristic of a voltage drop within a contact pair, it is also possible to perform a voltage measurement between two different contact pairs. In this way, it may be possible to obtain a piece of voltage information that is redundant for the at least one temperature measurement. This has the advantage that the result(s) of the temperature measurement can be subjected to a plausibility check.

According to a further aspect of the invention, a battery system is described which has a battery having at least one first connection element and an apparatus of the aforementioned type for classifying an electrical contact connection. In this case, the temperature sensor is arranged and set up to sense the temperature of the first connection element.

The battery system described is based on the insight that the apparatus described above for classifying an electrical contact connection can advantageously be integrated in the battery system. This advantageously integrates the functionality of the contact classification and possibly the functionality of the current reduction into the battery system.

The battery system described may be a battery module which can easily be used in an electric and/or hybrid vehicle and can possibly be interchanged with another battery system. The battery system may particularly be an interchangeable system which, following at least partial discharge, can be interchanged with a system having a charged battery at a service station provided specifically for the purpose.

The battery may have one or more battery cells. In this case, a plurality of battery cells may be connected in series and/or parallel with one another depending on the specific requirement.

The control device of the battery system described may be what is known as a battery management controller, for example, which controls the operation and particularly the charging and/or discharge of individual battery cells for optimum performance and/or the longest possible life.

According to a further aspect of the invention, a battery receiving system is described. The battery receiving system has a receiving apparatus for receiving a battery, at least one second connection element which is mounted on the receiving apparatus and an apparatus of the aforementioned type for classifying an electrical contact connection. In this case, the temperature sensor is arranged and set up to sense the temperature of the second connection element.

The battery receiving system described is based on the insight that the apparatus described above for classifying an electrical contact connection can advantageously be integrated into a battery receptacle. This advantageously integrates the functionality of the contact classification and possibly the functionality of the current reduction into the battery receptacle.

The battery receptacle may particularly be a vehicle-based battery receptacle for an electric vehicle or a hybrid vehicle.

By way of example, the control device for the battery receiving system described may be what is known as a power management controller which controls the electrical power requirements of the drive train in an electric vehicle and/or a hybrid vehicle.

According to a further aspect of the invention, an electrical power supply system for a vehicle, particularly for an electric and/or hybrid vehicle, is described. The power supply system described has a battery receiving system of the aforementioned type and a battery system of the aforementioned type. In this case, the second connection element of the battery receiving system is coupled to the first connection element of the battery system.

The electrical power supply system according to the invention is based on the insight that the apparatus described above for classifying an electrical contact connection can advantageously be integrated both into a battery system and into a battery receiving system. This means that a total of two apparatuses of the type described above are used in order to recognize temperature increases in the electrical contact region and hence a poor electrical contact quality between the (at least) one first connection element and the (at least one) second connection element particularly reliably.

According to one exemplary embodiment of the invention, the battery system has a first data interface which is coupled to the control device of the battery system.

In addition, the battery receiving system has a second data interface which is coupled to the control device of the battery receiving system. In this case, the first data interface and the second data interface are coupled to one another and set up such that interchange of temperature data between the two control devices is possible.

This has the advantage that the captured temperature data between the battery system and the battery receiving system can be compared with one another and checked for plausibility. This makes it possible to achieve redundancy for the temperature values obtained and hence to obtain increased data integrity.

The interfaces described may be arbitrary physical interfaces, such as a controller area network (CAN) interface, a local interconnect network (LIN) interface, a media oriented systems transport (MOST) interface and/or a FlexRay interface.

According to a further exemplary embodiment of the invention, the battery system has a first measuring device for measuring a first voltage difference between the first connection element and a further first connection element of the battery. The first measuring device is coupled to the control device of the battery system or is integrated in the control device of the battery system. In addition, the battery receiving system has a second measuring device for measuring a second voltage difference between the second connection element and a further second connection element which is directly or indirectly connected to the electrical load. The second measuring device is coupled to the control device of the battery receiving system or is integrated in the control device of the battery receiving system. The two data interfaces are set up such that information concerning the two measured voltage differences can be interchanged between the two control devices.

In this connection, interchange of voltage differences may mean particularly that (a) the control device of the battery system informs the control device of the battery receiving system about the level of the first voltage difference and that (b) the control device of the battery receiving system informs the control device of the battery system about the level of the second voltage difference.

The information interchange described for the two voltage differences has the advantage that at least one of the two control devices can perform a plausibility check for the sensed temperature values. This allows a considerable increase in the data integrity and the reliability of the whole electrical power supply system.

According to a further exemplary embodiment of the invention, at least one of the two control devices or a further control device is set up so as to compare the two voltage differences with one another. This has the advantage that the sensed voltage differences are combined to form a single piece of voltage information which can easily be used for a plausibility check on the sensed temperature values. The comparison of the voltage differences can be effected by means of simple difference formation, for example.

If this difference results at least approximately in a voltage difference of zero, the electrical contact resistances of the two contact pairs (first and second connection elements and further first and further second connection elements) should also be at least approximately the same. Since it is very unlikely that both contact pairs have a contact resistance that is increased in the same way, it can be assumed that the quality of the electrical contact connection is not adversely affected. If at least one temperature measurement nevertheless indicates an increased electrical contact resistance, it can be assumed in this case that the relevant temperature measurement is not correct.

According to a further aspect of the invention, a method for classifying an electrical contact connection between a first connection element of a battery and a second connection element which is directly or indirectly connected to an electrical load is described. The battery is particularly a battery for an electric vehicle and/or a hybrid vehicle. The method has (a) sensing of the temperature of the first connection element and/or of the second connection element by means of a temperature sensor, and (b) classification of the electrical contact connection between the first connection element and the second connection element by means of a control device, which is coupled to the temperature sensor, on the basis of a sensed signal from the temperature sensor.

The method described is also based on the insight that thermal monitoring of the electrical contact region between a battery and a corresponding battery receptacle allows early recognition of a poor electrical contact quality. If this involves a temperature being sensed which is significantly increased in comparison with the temperature which occurs for a normal operating state, it is possible to take suitable measures to reduce a current draw from the battery, as described more precisely above.

It is pointed out that embodiments of the invention have been described with reference to different subject matter of the invention. In particular, some embodiments of the invention are described by means of apparatus claims and other embodiments of the invention are described by means of method claims. Upon reading this application, however, a person skilled in the art will immediately understand that, unless explicitly stated otherwise, an arbitrary combination of features which are associated with different types of subject matter of the invention is also possible in addition to a combination of features which are associated with one type of subject matter of the invention.

Further advantages and features of the present invention emerge from the exemplary description of currently preferred embodiments below.

BRIEF DESCRIPTION OF THE SEVERAL VIEWS OF THE DRAWING

FIG. 2a shows a time profile for a current draw as a function of a temperature of a contact point which exceeds a prescribed reference temperature at one time.

FIG. 2b shows a time profile for a current draw as a function of a difference between (a) a first battery voltage which is measured on a first and on a further first connection element and (b) a second receptacle voltage which is measured on a second and on a further second connection element, with the difference exceeding a prescribed voltage difference at one time. The power supply system 100 shown in FIG. 1 has a battery 110 and a receiving apparatus 150. Since the battery 110 contains not only battery cells—not shown—but also functionalities for monitoring the operation of the battery 110, which are described below, this document also refers to the battery as a battery module or as a battery system 110. Correspondingly, the receiving apparatus 150 shown, which likewise has monitoring functionalities, is referred to as a battery receiving system 150.

DESCRIPTION OF THE INVENTION

Figure 1:
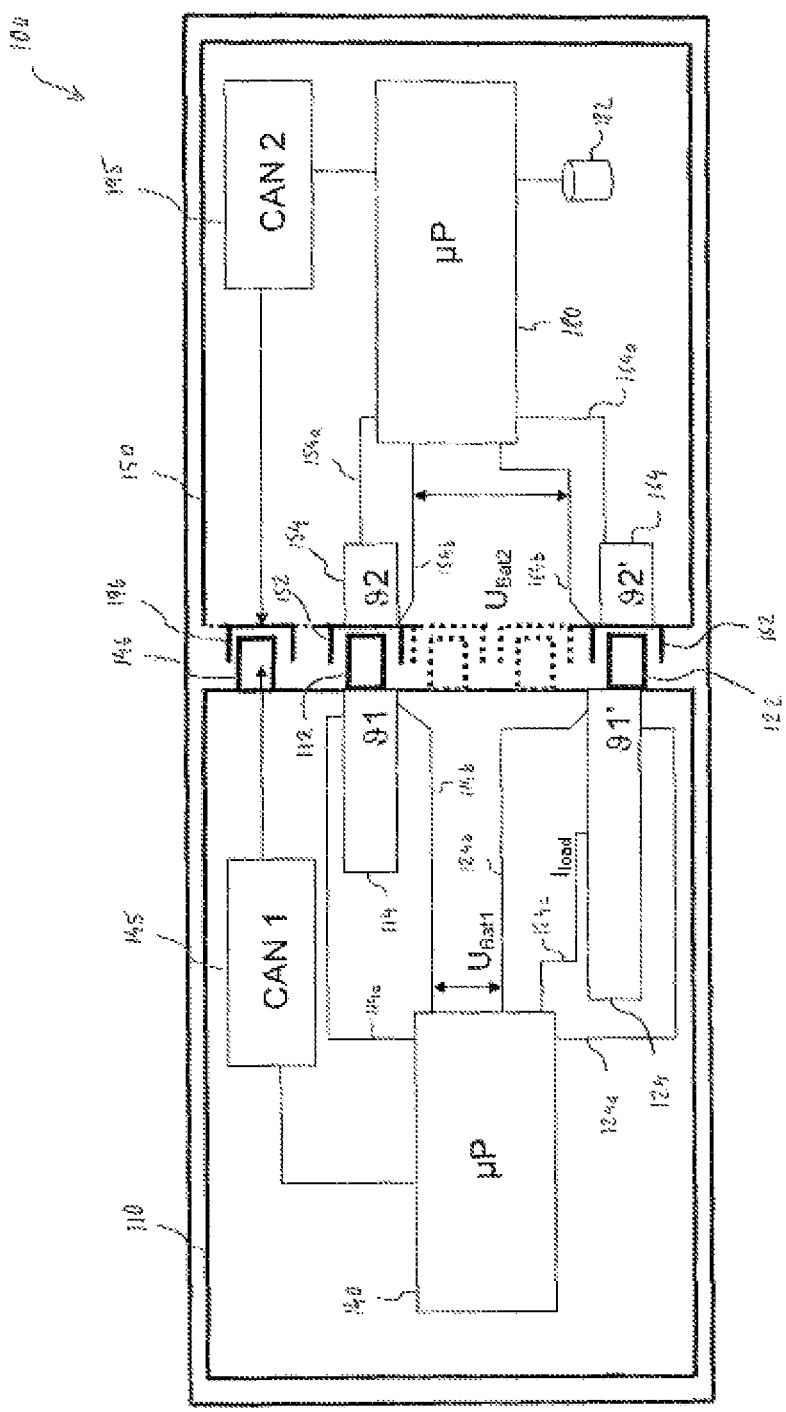
FIG. 1 shows a schematic illustration of an electrical power supply system which has two control devices and appropriate temperature sensors for monitoring the temperature of contact pairs which are used to connect a battery system and a battery receiving system of the power supply system to one another.

The battery system 110 has two battery poles. A first connection element 112 is the positive pole of the battery and a further first connection element 122 is the negative pole of the battery. The battery receiving system 150 has two connection terminals for making contact with the battery system 110. On the basis of the exemplary embodiment shown here, a second connection element 152 is used as a connection terminal for the positive pole 112. A further second connection element 162 is used as a connection terminal for the negative pole 122 of the battery system 110.

It is pointed out that the battery system 110 may optionally also have further connection elements, which are shown in dashes in FIG. 1 and are not provided with a reference symbol. Similarly, the battery receiving system 150 may optionally also have corresponding further connection terminals, which are likewise shown in dashes. Such further connection elements or connection terminals are useful particularly when the battery 110 has a plurality of battery cells which are connected in series and/or parallel with one another. The reason is that in that case current may possibly be drawn from different subunits of the battery independently.

As can be seen from FIG. 1, the battery system 110 has a control device 140, which may be what is known as a battery management controller, for example. The control device 140 is connected to a temperature sensor 114 by means of a measuring line 114a. The temperature sensor 114 is mounted on the first connection element 112 or is integrated therein. Correspondingly, the control device 140 is connected to a temperature sensor 124 by means of a measuring line 124a. The temperature sensor 124 is mounted on the further first connection element 122 or is integrated therein.

As can also be seen from FIG. 1, the battery receiving system 150 likewise has a control device 180, which may be what is known as a power management controller, for example. The control device 180 is connected to a temperature sensor 154 by means of a measuring line 154a. The temperature sensor 154 is mounted on the second connection element 152 or is integrated therein. Correspondingly, the control device 180 is connected to a temperature sensor 164 by means of a measuring line 164a. The temperature sensor 164 is mounted on the further second connection element 162 or is integrated therein.

The temperature sensors 114 and 124 provide the control device 140 with a respective temperature signal, and said control device evaluates the relevant temperature information. If an inadmissibly increased temperature for the first connection elements 112 and/or 122 is recognized in this case, the control device 140 takes suitable measures which reduce the current intensity drawn from the battery 110.

Correspondingly, the temperature sensors 154 and 164 provide the control device 180 with a respective temperature signal, and said control device likewise evaluates the relevant temperature information. In the event of an inadmissibly increased temperature for the second connection element 152 and/or the further second connection element 162, the control device 180 takes suitable measures in order to reduce the intensity of the current which flows via the contact pairs 112, 152 and 122, 162.

As a result of a reduction in the current draw from the battery 110, it is possible to effectively avoid critical operating states for the power supply system 100 described, particularly when the temperature increase is based on an increased contact resistance for a contact pair 112, 152 or 122, 162.

The battery system 110 also has an interface 145 which is likewise coupled to the control device 140. Correspondingly, the battery receiving system 150 likewise has an interface 195 which is coupled to the control device 180. According to the exemplary embodiment illustrated here, the two interfaces are what are known as controller area network (CAN) data interfaces.

As can be seen from FIG. 1, the two data interfaces 145 and 195 are connected to one another by means of a physical plug connection. This plug connection comprises an interface contact 146 on the battery and an interface contact 196 on the receptacle. Each of the two interface contacts may have a plurality of contact elements, such as contact pins or contact receptacles. The two control devices 140 and 195 can thus communicate with one another and interchange temperature data, for example. By aligning the temperature data captured from the battery and the temperature data captured from the receptacle, it is possible to check the temperature measurements for consistency. Such a plausibility check allows an increase in the data integrity and hence the reliability of the whole power supply system 100.

The battery receiving system 150 also has a data memory 182 which is coupled to the control device 180. The data memory 182 is preferably a nonvolatile memory. The data memory 182 can be used to store temperature data, and said temperature data can be read from said data memory for the purpose of diagnosis and/or maintenance, for example.

Optionally, in addition to the monitoring design described hitherto, which involves the temperature information being interchanged and/or evaluated, it is possible to apply a complementary monitoring design (e.g. for plausibility purposes). This involves the control device 140, for example, using two measuring lines 114b and 124b to sense a voltage $U_{Bat1}$ which is applied between the connection poles 112 and 122 of the battery system 110. This voltage information can also be evaluated by the control device 140 and/or provided for the control device 180 via the two interfaces 145 and 195 and also the two interface contacts 146 and 196.

Similarly, the voltage $U_{Bat2}$ which is applied between the two connection poles 152 and 162 of the battery receiving system 150 is also sensed by the control device 180 and using the two measuring lines 154b and 164b. This voltage information can also be evaluated by the control device 180 and/or provided for the control device 140 via the two interfaces 145 and 195 and also the two interface contacts 146 and 196.

According to the exemplary embodiment illustrated here, the sensed voltages $U_{Bat1}$ and $U_{Bat2}$ are thus aligned by interchanging the two pieces of information ascertained as voltage values via the interfaces 145 and 195 and also via the interface contacts 146 and 196 and comparing said pieces of information with one another. In the simplest case, the comparison may merely have a subtraction of the sensed voltages ($U_{Bat1}$ minus $U_{Bat2}$), with the corresponding difference formation being able to take place in the battery management controller 140 and/or in the power management controller 180.

If the difference formation shows that the voltage difference between $U_{Bat1}$ and $U_{Bat2}$ is too great, this is regarded as an explicit indication of an excessive contact resistance on at least one of the two contact pairs 112, 152 or 122, 162. As an immediate countermeasure, the intensity of the current flowing via these contact pairs is then reduced. This can be accomplished by using the power management controller 180 on the receptacle to reduce the power drawn from the battery system 110. By way of example, this can be achieved by means of flow control for the power output to a drive motor or to a drive train in an electric or hybrid vehicle.

According to the exemplary embodiment illustrated here, it is also possible for the intensity of the current provided by the battery 110 to be measured directly. As can be seen from FIG. 1, this is accomplished by means of a current measurement via a measuring line 124c on the connection pole 122 of the battery 110. The present current draw can be used together with the temperature information described above and possibly with the voltage information which is likewise described above as further information for classifying the quality of the contact connections between the connection elements 112, 152 and 122, 162.

It is pointed out that this current measurement, which can be effected by a magnetic sensor, such as a Hall sensor, for example, can also take place at another point in the power supply system 100.

FIG. 2a shows a time profile for a current draw $I_{load}$ as a function of a temperature σ for a contact point between two connection contacts. On the basis of the exemplary embodiment illustrated here, the temperature σ exceeds a prescribed reference temperature—represented by a dashed horizontal line—at a time $t_1$. The current draw is then reduced continuously. As a result of the reduction in the current draw, the temperature σ initially no longer rises as quickly, until, after reaching a maximum, it reaches the prescribed reference temperature again at a later time $t_2$. From the time $t_2$ onward, further reduction in the current draw is stopped. As a result, an at least approximately constant temperature σ is subsequently obtained on the basis of the exemplary embodiment illustrated here.

FIG. 2b shows a time profile for a current draw as a function of a difference between (a) a first battery voltage $U_{bat1}$, which is measured on a first and on a further first connection element, and (b) a second receptacle voltage $U_{bat2}$, which is measured on a second and on a further second connection element. On the basis of the exemplary embodiment illustrated here, the current draw $I_{load}$ from the battery initially rises. The same applies for the voltage difference "$U_{bat1}-U_{bat2}$", which exceeds a prescribed reference value—shown in dashes—at a time t1. The current draw $I_{load}$ then immediately starts to be continuously reduced. On the basis of the exemplary embodiment illustrated here, as a result of the reduction in the current draw $I_{load}$, the voltage difference "$U_{bat1}-U_{bat2}$" initially no longer rises as quickly, until, after reaching a maximum, it reaches the prescribed reference value again at a time $t_2$. From the time $t_2$ onward, the further reduction in the current draw is stopped. As a result, an at least approximately constant voltage difference "$U_{bat1}-U_{bat2}$" is subsequently obtained on the basis of the exemplary embodiment illustrated here.

It is pointed out that the extent of the reduction in the current draw $I_{load}$ or of the flow control for the power output may be dependent on the level of the ascertained temperature σ (cf. FIG. 2a) and/or on the magnitude of the ascertained voltage difference (cf. FIG. 2b).

LIST OF REFERENCE SYMBOLS

100 Power supply system
110 Battery system/battery
112 First connection element/battery pole (+)
114 Temperature sensor
114a Measuring line (temperature signal)
114b Measuring line (voltage level)
122 Further first connection element/battery pole (−)
124 Further temperature sensor
124a Measuring line (temperature signal)
124b Measuring line (voltage level)
124c Measuring line (current measurement)
140 Control device/battery management controller
145 First data interface/CAN interface
146 Interface contact
150 Battery receiving system/receiving apparatus
152 Second connection element/connection terminal (+)
154 Temperature sensor
154a Measuring line (temperature signal)
154b Measuring line (voltage level)
162 Further second connection element/connection terminal (−)
164 Further temperature sensor
164a Measuring line (temperature signal)
164b Measuring line (voltage level)
180 Control device/power management controller
182 Data memory (nonvolatile)
195 Second data interface/CAN interface
196 Interface contact

The invention claimed is:

1. An apparatus for classifying an electrical contact connection between a voltage terminal of a battery and a connection element directly or indirectly connected to an electrical load, the apparatus comprising:
a temperature sensor disposed for sensing a temperature of one or both of the voltage terminal or of the connection element; and
a control device coupled to said temperature sensor and configured to take a sensed signal from the temperature sensor as a basis for determining a contact resistance of the electrical contact connection between the voltage terminal and the connection element.

2. The apparatus according to claim 1, wherein the battery is a battery for an electric vehicle or a battery for a hybrid vehicle.

3. The apparatus according to claim 1, wherein said control device is configured to reduce an intensity of a current flowing through the voltage terminal and the connection element if the sensed signal exceeds a prescribed reference value.

4. The apparatus according to claim 3, wherein an extent of a reduction in the intensity of the current is dependent on the difference between the value of the sensed signal and the prescribed reference value.

5. The apparatus according to claim 3, wherein the current flow is effected by flow control for a power output from the battery.

6. The apparatus according to claim 1, wherein said temperature sensor is:
disposed on the voltage terminal or the connection element; or
integrated in the voltage terminal or the connection element.

7. The apparatus according to claim 1, which further comprises:
a data memory coupled to said control device; and
wherein said control device is configured to store a result for the classification of the electrical contact connection in said data memory.

8. The apparatus according to claim 1, which further comprises:
at least one further temperature sensor for sensing a temperature of at least one further voltage terminal of the battery and/or of at least one further connection element that is directly or indirectly connected to the electrical load; and
wherein said control device is coupled to said further temperature sensor and configured to take a sensed signal from said further temperature sensor as a basis for determining a contact resistance and classifying the electrical contact connection between the further futher voltage terminal and the further connection element.

9. The apparatus according to claim 1, which further comprises:
a measuring device for measuring a voltage difference:
between the voltage terminal and a further voltage terminal of the battery; or
between the connection element and a further connection element; and
wherein said measuring device is coupled to said control device or is integrated in said control device.

10. A battery system, comprising:
a battery having at least one voltage terminal; and
an apparatus according to claim 1;
wherein the temperature sensor is disposed and configured to sense a temperature of said voltage terminal of the said battery.

11. A battery receiving system, comprising:
a receiving apparatus for receiving a battery;
at least one connection element mounted to said receiving apparatus; and
an apparatus according to claim 1;
wherein the temperature sensor is configured to sense a temperature of said connection element.

12. A method for classifying an electrical contact connection between a voltage terminal of a battery and a connection element directly or indirectly connected to an electrical load, the method which comprises:
sensing a temperature of the voltage terminal and/or of the connection element by way of a temperature sensor, and
determining a contact resistance at the electrical contact connection between the voltage terminal and the connection element by way of a control device connected to the temperature sensor, based on a sensed signal received from the temperature sensor.

13. The method according to claim 12, wherein the battery is a battery for an electric vehicle and/or a hybrid vehicle.

* * * * *